United States Patent
Morozumi

(10) Patent No.: US 6,358,830 B1
(45) Date of Patent: Mar. 19, 2002

(54) METHOD FOR MANUFACTURING SEMICONDUCTOR DEVICE HAVING INTERLAYER DIELECTRIC FILM LAYERS WITH LIKE ETCH SPEEDS

(75) Inventor: Yukio Morozumi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/470,804

(22) Filed: Dec. 22, 1999

(30) Foreign Application Priority Data

Dec. 22, 1998 (JP) .......................................... 10-365193

(51) Int. Cl.[7] .............................................. H01L 21/44
(52) U.S. Cl. ........................ 438/597; 438/638; 438/704
(58) Field of Search .................... 438/638, 624, 438/704, 597

(56) References Cited

U.S. PATENT DOCUMENTS

| | | | |
|---|---|---|---|
| 3,571,914 A | 3/1971 | Lands et al. ................ | 438/143 |
| 4,829,024 A | 5/1989 | Klein et al. .................. | 438/14 |
| 5,019,891 A | 5/1991 | Onuki et al. ................ | 257/763 |
| 5,180,689 A | 1/1993 | Liu et al. .................... | 438/640 |
| 5,288,665 A | 2/1994 | Nulman ...................... | 438/672 |
| 5,371,042 A | 12/1994 | Ong ............................ | 438/653 |
| 5,378,652 A | 1/1995 | Samata et al. .............. | 438/647 |
| 5,407,863 A | 4/1995 | Katsura et al. ............. | 438/660 |
| 5,498,768 A | 3/1996 | Nishitani et al. ........... | 438/644 |
| 5,504,043 A | 4/1996 | Ngan et al. ................. | 438/655 |
| 5,523,626 A | 6/1996 | Hayashi et al. ............. | 257/776 |
| 5,627,391 A | 5/1997 | Shimada et al. ............ | 257/310 |
| 5,712,194 A | 1/1998 | Kanazawa ................... | 438/618 |
| 5,716,890 A | 2/1998 | Yao ............................. | 438/624 |
| 5,739,046 A | 4/1998 | Lur et al. .................... | 438/653 |
| 5,789,819 A | 8/1998 | Gnade et al. ............... | 257/719 |
| 5,811,849 A | 9/1998 | Matsuura .................... | 253/306 |
| 5,843,843 A | 12/1998 | Lee et al. .................... | 438/688 |
| 5,918,149 A | 6/1999 | Besser et al. ................ | 438/680 |
| 5,936,295 A | 8/1999 | Havemann et al. ......... | 257/522 |
| 5,939,787 A | 8/1999 | Lee ............................. | 257/740 |
| 5,956,608 A | 9/1999 | Khurana et al. ............ | 738/627 |
| 5,981,362 A | 11/1999 | Saito ........................... | 438/488 |
| 5,985,747 A | 11/1999 | Taguchi ...................... | 438/622 |
| 6,007,684 A | 12/1999 | Fu .............................. | 264/192.17 |
| 6,054,768 A | 4/2000 | Givens et al. .............. | 257/753 |
| 6,107,182 A | 8/2000 | Asahina et al. ............. | 438/618 |
| 6,137,176 A | 10/2000 | Morozumi et al. ......... | 257/751 |

FOREIGN PATENT DOCUMENTS

WO 98/24116 6/1998

OTHER PUBLICATIONS

S.McClatchie, I.Beekmann, A.Kiermasz, C.Dobson—Electrotech Ltd. UK "Inorganic CVD Planarisation", printed in European Semiconductor, Sep. 1995.

Primary Examiner—John F. Niebling
Assistant Examiner—Stacy A Whitmore
(74) Attorney, Agent, or Firm—Hogan & Hartson, L.L.P.

(57) ABSTRACT

An interlayer dielectric film is formed over a semiconductor substrate that may have a device element formed thereon. The interlayer dielectric film includes at least a first silicon oxide film and a second silicon oxide film as a cap layer being formed on the first silicon oxide film. The first silicon oxide film is formed by reacting $SiH_4$ and $H_2O_2$ by a CVD method. The first silicon oxide film and the second silicon oxide film may be isotropically etched to form a through hole. The isotropic etching speed for the first silicon oxide film is the same as or generally the same as the etching speed for the second silicon oxide film (the cap layer). As a result, both the first silicon oxide film and the second silicon oxide film can be isotropically etched without causing excessive etching on the first silicon oxide film Therefore, the degree of freedom in isotropic etching is improved in isotropically etching multiple layers.

14 Claims, 6 Drawing Sheets

METHOD FOR MANUFACTURING SEMICONDUCTOR DEVICE HAVING INTERLAYER DIELECTRIC FILM LAYERS WITH LIKE ETCH SPEEDS

BACKGROUND OF THE INVENTION

1. Field of the Invention

The present invention relates to a semiconductor device and a method for manufacturing a semiconductor device.

2. Description of Related Art

An interlayer dielectric film used in manufacturing a semiconductor device may be composed of a plurality of films. Such an interlayer dielectric film is disclosed in Japanese Laid-open patent application HEI 4-218947. For example, an interlayer dielectric film may be composed of a base layer of a silicon oxide film, an SOG film disposed over the base layer, and a cap layer of a silicon oxide film disposed over the SOG film. The interlayer dielectric film may have a through hole formed therein. An internal wall of the through hole may be provided with a tapered section, such that a conductive film fills the through hole with good coverage.

In order to form the through hole having such a tapered shape, first, the interlayer dielectric film is selectively, isotropically etched, and the etching is stopped halfway. Due to the isotropic etching, the interlayer dielectric film is etched not only in a vertical direction, but also in a lateral direction. The closer to the upper surface of the through hole, the greater the through hole is etched in the lateral direction. As a result, the internal surface has a tapered section. Then, the etching is changed to an anisotropic etching to selectively etch the remaining interlayer dielectric film. By the steps described above, the through hole is completed.

It is noted that the etching speed for the SOG film is substantially greater than that for the cap layer. As a result, if the SOG film is isotropically etched, portions of the SOG film in the lateral direction are excessively etched. This creates recesses in the internal wall of the through hole.

Because of this reason, the isotropic etching is stopped in the cap layer, and thus the degree of freedom in conducting the isotropic etching is limited. As a consequence, for example, there are instances in which a conductive film may not fill a through hole having a relatively large aspect ratio.

SUMMARY OF THE INVENTION

It is an object of an embodiment of the present invention to provide a method for manufacturing a semiconductor device that improves the degree of freedom in isotropic etching and to provide a semiconductor device manufactured by the method.

In accordance with one embodiment of the present invention, a semiconductor device has a semiconductor substrate defining a main surface and an interlayer dielectric film located over the main surface, wherein the interlayer dielectric film includes a through hole having an upper surface section, a lower surface section and an internal surface having a tapered section between the upper surface section and the lower surface section.

In accordance with one embodiment of the present invention, the semiconductor memory device is manufactured by a method including at least the steps of: (a) reacting a silicon compound with hydrogen peroxide by a CVD method to form a first silicon oxide film that forms at least a part of the interlayer dielectric film; (b) reacting a silicon compound with at least oxygen or a compound including oxygen by a CVD method to form a second porous silicon oxide film that forms at least a part of the interlayer dielectric film and serves as a cap layer on the first silicon oxide film; and (c) selectively, isotropically etching the first silicon oxide film and the second silicon oxide film, to form a through hole that includes an internal surface having a tapered section, such that the through hole becomes smaller in a direction from the upper surface section toward the lower surface section.

A semiconductor device manufactured by a manufacturing method in accordance with one embodiment of the present invention has a semiconductor substrate defining a main surface and an interlayer dielectric film located over the main surface. The interlayer dielectric film includes a first silicon oxide film that is formed by reacting a silicon compound with hydrogen peroxide through a polycondensation reaction, and a second silicon oxide film that forms a cap layer and is located over the first silicon oxide film.

The interlayer dielectric film therefore includes a through hole that is formed in the first silicon oxide film and the second silicon oxide film and has an upper surface section, a lower surface section, and an internal surface between the upper surface section and the lower surface section. The internal surface includes a tapered section in such a manner that the through hole becomes smaller in diameter from the upper surface section toward the lower surface section.

In accordance with an embodiment of the present invention, the first silicon oxide film may be formed instead of an SOG film, in step (a). Preferably, the isotropic etching speed for the first silicon oxide film is the same or substantially the same as the isotropic etching speed for the second silicon oxide film. As a result, the first silicon oxide film can also be isotropically etched, and therefore, the degree of freedom in isotropic etching is improved.

The isotropic etching speed for the second silicon oxide film needs to be the same or substantially the same as the isotropic etching speed for the first silicon oxide film. The second silicon oxide film having such characteristics may be formed by a common CVD method, such as, for example, pyrolysis (thermal decomposition), and hydrolysis of a silane compound. The second silicon oxide film may be formed by a normal pressure CVD method, a plasma CVD method or a reduced pressure CVD method.

An impurity, such as, for example, phosphorous, boron or the like may preferably be added to the porous second silicon oxide film. More preferably, phosphorous is added to the second silicon oxide film. As a result the second silicon oxide film can relieve stresses by weakening the molecular bonding force between Si and O molecules of the silicon oxide that forms the film. As a result, the film becomes moderately soft and yet hard enough to be cracked. One of the roles of the second silicon oxide film is a function in which the impurity such as phosphorous contained in the silicon oxide film functions as a getter of mobile ions, such as alkali-ions that have deteriorating effects on the device element-reliability characteristics. The impurity concentration of the impurity contained in the second silicon oxide film may preferably be about 1–6 weight %, in consideration of the gettering function and the stress relieving function of the film.

Further, the second silicon oxide film has a function to prevent the first silicon oxide film from absorbing moisture. Also, the second silicon oxide film has an internal compression stress. Accordingly, when other films that form the interlayer dielectric film have internal tensile stresses, the second silicon oxide film alleviates the stresses and prevents the generation of cracks in the interlayer dielectric film.

A plasma CVD method for forming the second silicon oxide film may preferably be conducted with a high frequency at temperatures of about 300–450° C. This step is effective in disconnecting water content from the first silicon oxide film.

The compound including oxygen that is used to form the second silicon oxide film may be oxygen ($O_2$). However, more preferably, nitrogen monoxide ($N_2O$) may preferably be used as the compound including oxygen to form the second silicon oxide film. By the use of nitrogen monoxide as a reactant gas, the nitrogen monoxide in a plasma state likely reacts with a hydrogen bond (—H) of the silicon compound that forms the first silicon oxide film. As a result, disconnection of gasification components (hydrogen, water) from the first silicon oxide film is promoted even while the second silicon oxide film is being formed.

Alternatively, a normal pressure CVD method at temperatures of about 300–550° C. may be conducted to form the second silicon oxide film, instead of the plasma CVD method. In this case, ozone may be used as a compound including oxygen to form the second silicon oxide film.

Also, before the second silicon oxide film is formed, the first silicon oxide film may preferably be exposed to an ozone atmosphere. Since ozone likely reacts with a hydrogen bond (—H) and a hydroxyl (—H) of the silicon compound that forms the first silicon oxide film, this step promotes disconnection of hydrogen and water from the first silicon oxide film.

The thickness of the second silicon oxide film is preferably about 100 nm or greater in consideration of the planarization, prevention of cracks and the thickness of the interlayer dielectric film.

In accordance with one embodiment of the present invention, the first silicon oxide film may be formed by reacting a silicon compound and hydrogen peroxide through a CVD method. As a result, the formed interlayer dielectric film has an excellent planarization characteristic. More specifically, the first silicon oxide film thus formed has a high flowability itself and a high self-planarization characteristic. This phenomenon is believed to take place due to the following mechanism. When a silicon compound and hydrogen peroxide are reacted by the CVD method, silanol is formed in a vapor phase, and the silanol deposits on the surface of the wafer, thereby providing a film having a high flowability.

For example, when monosilane is used as a silicon compound, silanol is formed by reactions defined by formulas (1) and (1)' as follows:

$$SiH_4 + 2H_2O_2 \rightarrow Si(OH)_4 + 2H_2 \qquad \text{Formula (1)}$$

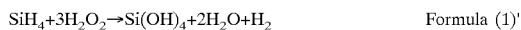

$$SiH_4 + 3H_2O_2 \rightarrow Si(OH)_4 + 2H_2O + H_2 \qquad \text{Formula (1)'}$$

Silanol formed by the reactions defined by Formulae (1) and (1)' becomes silicon oxide as a result of disconnection of water by a polycondensation reaction defined by Formula (2) as follows:

$$Si(OH)_4 \rightarrow SiO_2 + 2H_2O \qquad \text{Formula (2)}$$

The silicon compounds include, for example, inorganic silane compounds, such as monosilane, disilane, $SiH_2Cl_2$, $SiF_4$, and organic silane compounds, such as $CH_3SiH_3$, dimethylsilane, tripropyle-silane, tetraethylorthosilicate and the like.

The film formation in step (a) described above may preferably be conducted by a reduced pressure CVD method at temperatures of about 0–20° C. when the silicon compound is an inorganic silicon compound, and at temperatures of about 0–150° C. when the silicon compound is an organic silicon compound. If the temperature during the film-forming step is higher than the upper limit of the above-described temperature ranges, the polycondensation reaction defined by Formula (2) progresses excessively. As a result, the flowability of the first silicon oxide film lowers and therefore it is difficult to obtain good planarization. On the other hand, if the temperature is lower than the lower limit of the above-described temperature ranges, the control of a film forming apparatus becomes difficult. For example, adsorption of formed water content occurs within the chamber and dew condensation occurs outside the chamber.

The first silicon oxide film formed in accordance with one embodiment of the present invention may preferably be formed with a thickness that sufficiently covers step differences of the underlying layer. The minimum thickness of the first silicon oxide film depends on the height of protrusions and recesses of the underlying layer, and is preferably between about 300 and about 1500 nm. If the film thickness of the first silicon oxide film exceeds over the above-described upper limit, cracks may occur due to stresses of the film itself.

The manufacturing method may preferably include the step of annealing the interlayer dielectric film at temperatures of about 350–500° C. between step (b) and step When the interlayer dielectric film includes a third silicon oxide film (base layer) that is located below the first silicon oxide film, the manufacturing method may preferably include the following step. Namely, the manufacturing method may preferably include, before step (a), the step of forming a third silicon oxide film by reacting a silicon compound with at least one of oxygen and a compound including oxygen by a CVD method.

The base layer has a passivation function that prevents migration of water and excess impurities from the first silicon oxide film to an underlying layer below the base layer (a main surface of a semiconductor substrate when there is no underlying layer). Also, the base layer has a function to increase the cohesiveness between the first silicon oxide film and an underlying layer below the base layer (a main surface of a semiconductor substrate when there is no underlying layer).

When a gettering effect is required to get alkali-ions, an impurity such as, for example, phosphorous in the amount of about 1–6 weight % may be added to the third silicon oxide film that forms the base layer. Alternatively, for example, a PSG film containing phosphorous in the amount of about 1–6 weight % may be formed between the third silicon oxide film and the first silicon oxide film.

In the manufacturing method in accordance with one embodiment of the present invention, step (c) may include the steps of selectively, isotropically etching the first silicon oxide film and the second silicon oxide film to form an upper section of the through hole that includes the tapered section, and selectively, anisotropically etching the interlayer dielectric film located below the upper section to form a lower section of the through hole. The upper section of the through hole may or may not reach the third silicon oxide film. In other words, the border between the upper section and the lower section of the through hole may be located at a position where the third silicon oxide film is formed, or at a position where the first silicon oxide film is formed. The through hole formed in the interlayer dielectric film of the semiconductor device is thus composed of the lower section and the upper section that is located above the lower section and includes the tapered section.

In accordance with one embodiment of the present invention, the manufacturing method may preferably include, after step (c), the step of forming a barrier layer that becomes a part of a wiring on surfaces of the through hole and the interlayer dielectric film, and the step of forming a conductive film that becomes a part of the wiring on surfaces of the barrier layer.

In one embodiment of the present invention, the interlayer dielectric film in the semiconductor device has a through hole. The semiconductor device further includes a barrier layer that becomes a part of a wiring that is formed on surfaces of the through hole and the interlayer dielectric film, and a conductive film that becomes a part of the wiring on surfaces of the barrier layer.

In accordance with one embodiment of the present invention, the conductive film may preferably be formed by the following steps. A first aluminum film composed of aluminum or an aluminum alloy containing aluminum as a main component is formed in the through hole at temperatures of about 200° C. or lower, and then a second aluminum film composed of aluminum or an aluminum alloy containing aluminum as a main component is formed at temperatures of about 300° C. or higher.

The alloy containing aluminum as a main component may be a two-component or a three-component alloy containing at least one of copper, silicon, germanium, magnesium, cobalt, beryllium and the like.

Other features and advantages of the invention will be apparent from the following detailed description, taken in conjunction with the accompanying drawings which illustrate, by way of example, various features of embodiments of the invention.

PREFERRED EMBODIMENTS

Figure 1:
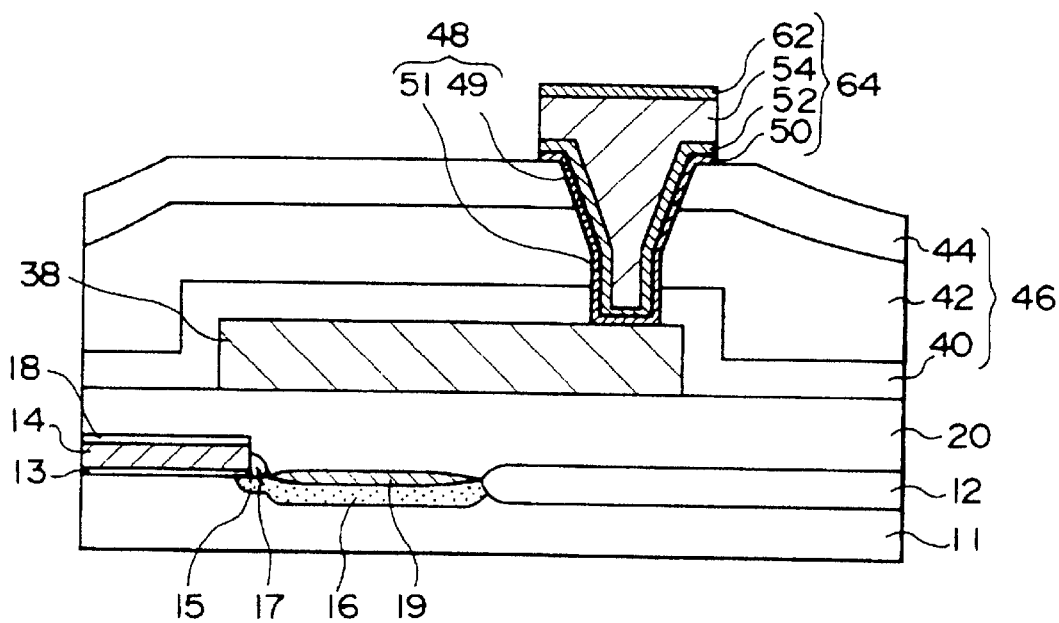
FIG. 1 is a cross-sectional view of a structure of a semiconductor device in accordance with a first embodiment of the present invention.

FIG. 1 is a cross sectional view of a structure of a semiconductor device in accordance with one embodiment of the present invention. First, the structure of the semiconductor device in accordance with the first embodiment of the present invention is briefly described. A silicon substrate 11 has a main surface, and a MOS field effect transistor having a gate electrode 14 is formed on the main surface. An interlayer dielectric film 20 is formed on the main surface of the silicon substrate 11 such that it covers the MOS field effect transistor.

A first metal wiring layer 38 is formed on the interlayer dielectric film 20. An interlayer dielectric film 46 is formed over the interlayer dielectric film 20 in such a manner that the interlayer dielectric film 46 covers the first metal wiring layer 38. The interlayer dielectric film 46 has a three-layer structure.

In one embodiment, the interlayer dielectric film 46 includes three silicon oxide films. For example, a third silicon oxide film 40 as a base layer is disposed at the lowest level. A first silicon oxide film 42 is disposed over the third silicon oxide film 40. The first silicon oxide film 42 is formed through a polycondensation reaction between a silicon compound and hydrogen peroxide. A second silicon oxide film 44 as a cap layer is disposed over the first silicon oxide film 42.

A through hole 48 that reaches the first metal wiring layer 38 is formed in the interlayer dielectric film 46. The through hole 48 is composed of a lower section 51 and an upper section 49 that includes an internal wall having a tapered section. The tapered section refers to a portion of the internal wall of the through hole 48 in which the through hole 48 becomes smaller from an upper section toward a lower section. The size of the through hole 48 does not change in the lower section 51.

A second metal wiring layer 64 is formed on the interlayer dielectric film 46. The first metal wiring layer 38 and the second metal wiring layer 64 are electrically connected to each other by a conductive film including an aluminum film that fills the through hole 48.

A method for manufacturing a semiconductor device in accordance with a first embodiment of the present invention will be described. The method will be described in the process order with reference to FIGS. 2–8 that illustrate cross sections of the structure.

Figure 2:
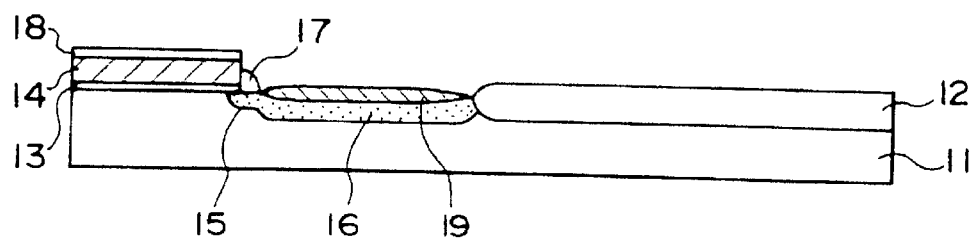
FIG. 2 shows a first step in a process for making a semiconductor device in cross section in accordance with the first embodiment of the present invention.

A MOS field effect transistor is formed on a silicon substrate 11 by, for example, a commonly practiced method, as shown in FIG. 2. For example, a field insulation film 12 is formed on the silicon substrate 11 by selective oxidation, and a gate oxide film 13 is formed in an active region. A threshold voltage level is adjusted by channel injection, then a tungsten silicide is sputter-deposited on a polysilicon layer that is grown by thermally decomposing $SiH_4$. Further, a silicon oxide film 18 is deposited on the tungsten silicide. The layers are etched to a specified pattern to form a gate electrode 14.

Then, phosphorous is ion-implanted to form a low concentration impurity layer 15 for a source region or a drain region. A side-wall spacer 17 of a silicon oxide film is formed on a side of the gate electrode 14. Then arsenic is ion-implanted, and the impurity is activated by an anneal treatment using a halogen lamp to thereby form a high impurity concentration layer 16 for the source region or the drain region.

Next, a CVD silicon oxide film having a film thickness of about 100 nm or less is formed, and the film is selectively etched by a mixed solution of HF and $NH_4F$ to expose designated areas of the silicon substrate. Then, for example, titanium is sputtered to a film thickness of about 30–100 nm, and a rapid anneal is conducted for about several seconds to 60 seconds at temperatures of about 650–750° C. in a nitrogen atmosphere in which oxygen content is controlled to 50 ppm or less. As a result, a layer of titanium monosilicide is formed on the main surface of the silicon substrate, and a layer of titanium-rich titanium nitride (TiN) is formed on the silicon oxide film 18. When immersed in a mixed solution of $NH_4OH$ and $H_2O_2$, the titanium nitride layer is etched and removed, and the titanium monosilicide layer remains only on the main surface of the silicon substrate. Further, lamp anneal is performed at temperatures of about 750–850° C. to change monosilicide of the monosilicide layer to disilicide, such that a titanium silicide layer 19 is formed on the surface of the high concentration impurity layer 16 in a self-alignment manner.

If the gate electrode 14 is formed only with polysilicon and a selective etching is performed, the gate electrode and source/drain regions are separated from one another by a side wall spacer; in other words, a titanium salicide structure is formed.

The salicide structure may be formed from a tungsten silicide or a molybdenum silicide, instead of the titanium silicide.

Figure 3:
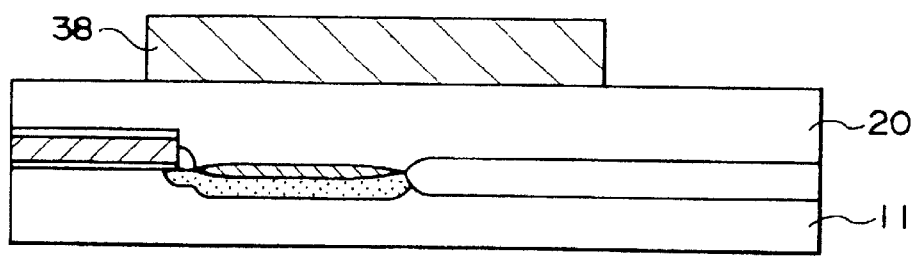
FIG. 3 shows a second step in the process for making the semiconductor device in cross section in accordance with the first embodiment of the present invention.
Figure 4:
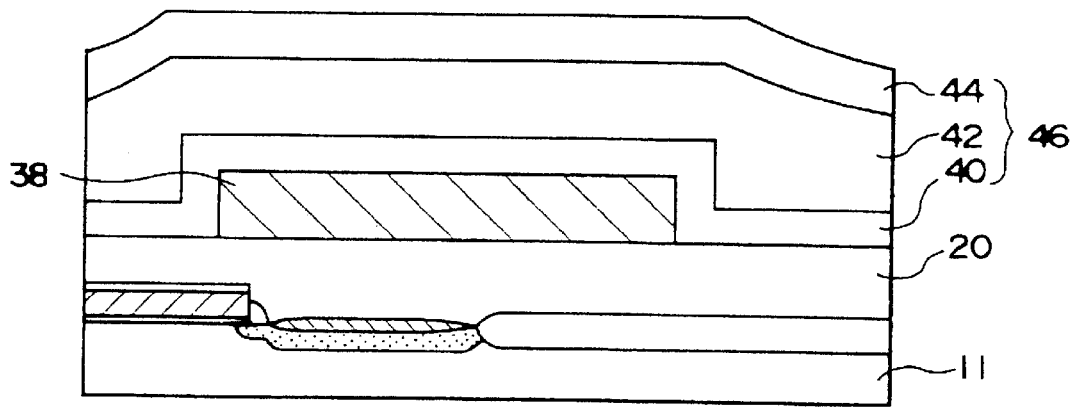
FIG. 4 shows a third step in the process for making the semiconductor device in cross section in accordance with the first embodiment of the present invention.

Then, referring to FIG. 3, an interlayer dielectric film 20 including a silicon oxide film is formed by, for example, a CVD method. Known film forming conditions may be used for forming the interlayer dielectric film 20. The interlayer dielectric film 20 may have a single-layer structure or a multiple-layer structure.

Then, a first metal wiring layer 38 including an aluminum film is formed by, for example, sputtering on the interlayer dielectric film 20. The first metal wiring layer 38 may have a single-layer structure or a multiple-layer structure.

A third silicon oxide film 40 having a film thickness of about 50–200 nm is formed by reacting tetraethylorthosilicate (TEOS) with oxygen at temperatures of about 300–500° C. through a plasma CVD method. The silicon oxide film 40 does not cause oxidation or cusping of the first metal wiring layer 38, and has a greater insulation, a slower etching speed against a hydrogen fluoride solution, and a higher density than a layer that is grown from $SiH_4$.

Then, a first silicon oxide film 42 is formed by a CVD method through reaction between $SiH_4$ and $H_2O_2$ using nitrogen gas as a carrier under a reduced pressure of about $2.5 \times 10^2$ Pa or lower in accordance with a preferred embodiment, and more preferably, about $0.3 \times 10^2 – 2.0 \times 10^2$ Pa. The first silicon oxide film 42 has a film thickness that is greater than at least a step difference in the third silicon oxide film 40. In other words, the first silicon oxide film 42 is formed to have a film thickness that sufficiently covers a step difference in the underlying film. A maximum film thickness of the first silicon oxide film 42 is set such that cracks are not generated in the film. For example, the film thickness of the first silicon oxide film 42 is preferably greater than a step difference in the underlying layer to achieve an optimum planarization, and may preferably be in a range between about 300 and 1500 nm.

Film formation temperature for the first silicon oxide film 42 depends on its flowability during the film formation thereof. A high film formation temperature lowers the flowability of the film and deteriorates the planarization. Accordingly, in a preferred embodiment, the film formation temperature is set at about 0–20° C., and more preferably at about 0–10° C.

The flow quantity of $H_2O_2$ is not particularly restricted to a specified level. However, the quantity of $H_2O_2$ may preferably be set at a concentration ratio of 55–65 volume %, and twice or more as that of $SiH_4$. In one embodiment, for example, the flow quantity of $H_2O_2$ is preferably set at a gas flow rate ranging from about 100 to about 1000 SCCM (Standard Cubic Centimeter Minute), in consideration of uniformity of the film and through-put.

The first silicon oxide film 42 formed in this step is in the form of silanol polymer, has a high level of flowability and a high level of self-planarization characteristic. Also, the first silicon oxide film 42 has a high level of moisture absorption capability due to numerous amounts of hydroxyl (—H) contained therein.

Next, the substrate is left in the chamber under a reduced pressure for about 30–120 seconds to remove some water content from the first silicon oxide film 42. Then, a plasma CVD method is successively conducted with the presence of $SiH_4$, $PH_3$ and $N_2O$ gases at temperatures of about 300–450° C. at high frequencies of about 200–600 khz. As a result, the gases react with one another and form a PSG film (second silicon oxide film) 44 having a film thickness of about 100–600 nm. In a preferred embodiment, the second silicon oxide film 44 is successively formed after film formation of the first silicon oxide film 42 in consideration of high moisture absorption capability of the first silicon oxide film 42. Alternatively, the second silicon oxide film 44 may be formed after the first silicon oxide film 42 is reserved in an atmosphere that does not include water content.

The second silicon oxide film 44 needs to be porous such that gasification components such as water and hydrogen contained in the first silicon oxide film 42 are readily and thoroughly removed in an anneal treatment that is later performed. Accordingly, the second silicon oxide film 44 is preferably formed by a plasma CVD method at temperatures of about 450° C. or lower, and more preferably at temperatures of about 300–400° C., and at a frequency of about 1 MHz or lower, and more preferably at a frequency of about 200–600 khz. Also, in a preferred embodiment, the second silicon oxide film 44 contains an impurity such as phosphorous. When the second silicon oxide film 44 contains such an impurity, the second silicon oxide film 44 becomes more porous, with the result that stresses acting on the film are alleviated, and the film obtains a gettering effect with respect to alkali ions. The level of concentration of the impurity is determined in consideration of the gettering effect and resistance to stresses. For example, when phosphorous is added as an impurity, the concentration of the phosphorous may preferably be set at about 2–6 weight %.

Also, $N_2O$ is used as a compound containing oxygen in the plasma CVD method. The use of $N_2O$ promotes separation of hydrogen bonds in the first silicon oxide film 42. As a result, gasification components such as water and hydrogen contained in the first silicon oxide film 42 are removed more securely.

The film thickness of the second silicon oxide film 44 is determined in consideration of its role of adjusting the required thickness of the interlayer dielectric film and the function of $N_2O$ that promotes separation of hydrogen bonds. In a preferred embodiment, the second silicon oxide film 44 may have a film thickness of about 100 nm or greater, and more preferably a film thickness of about 200–600 nm.

Then, an anneal treatment is conducted in a nitrogen at temperatures of about 350–500° C. By this anneal treatment, the first silicon oxide film 42 and the second silicon oxide film 44 are densified and have good insulation and water-resistance characteristics. When the annealing temperature is set at 350° C. or higher, polycondensation reaction of silanol in the first silicon oxide film 42 is almost perfectly completed, such that water and hydrogen contained in the film are sufficiently discharged and the film is densified. The annealing temperature, set at 500° C. or lower, does not cause deteriorating effects on an aluminum film that forms the first metal wiring layer 38. The annealing temperature may preferably be set as high as permissible. This is because (1) the insulation characteristic of the interlayer dielectric film improves and (2) the interlayer dielectric film becomes resistive to deteriorating effects by a heat treatment to be performed later.

In the anneal treatment, the wafer temperature is elevated continuously or in stages in order to reduce effects of thermal strains against the first silicon oxide film 42. In other words, a ramping anneal is preferably conducted.

If the interlayer dielectric film 46 is to be located between the main surface of the silicon substrate 11 and the first metal wiring layer 38 (at a location where the interlayer dielectric film 20 is formed), the anneal treatment may be conducted at temperatures at about 500° C. or higher, because an aluminum wiring is not formed.

Figure 5:
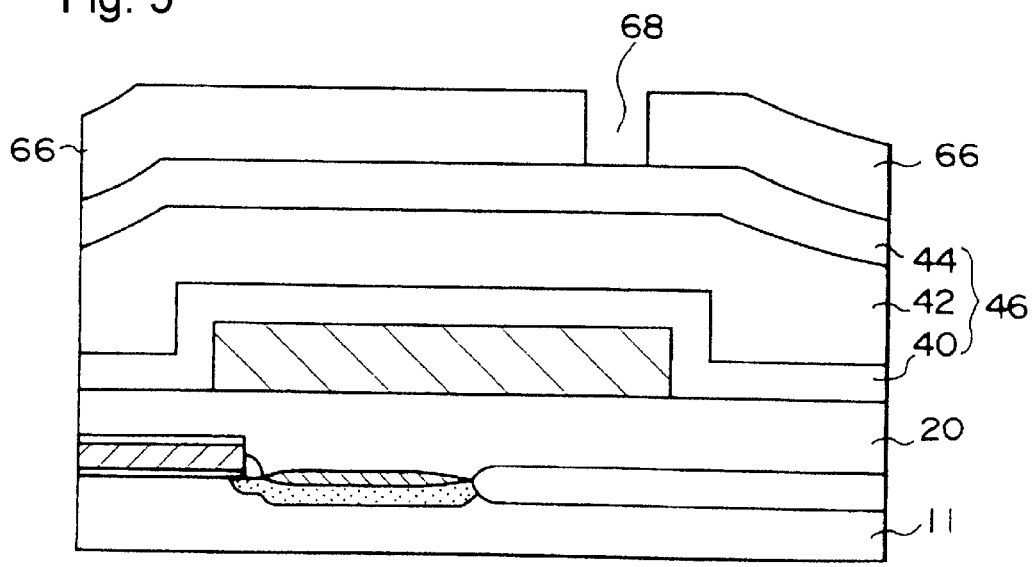
FIG. 5 shows a fourth step in the process for making the semiconductor device in cross section in accordance with the first embodiment of the present invention.

As shown in FIG. 5, a resist 66 is formed on the interlayer dielectric film 46. The resist is selectively exposed and developed to form an opening 68.

Figure 6:
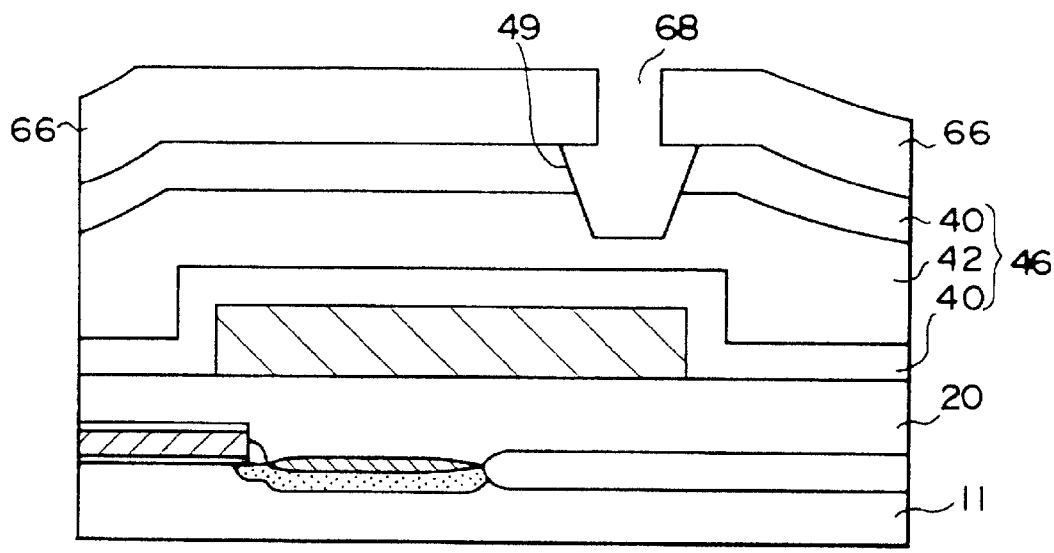
FIG. 6 shows a fifth step in the process for making the semiconductor device in cross section in accordance with the first embodiment of the present invention.

Referring to FIG. 6, the interlayer dielectric film 46 is selectively, isotropically etched, using a solution including HF. This etching process is stopped when the first silicon oxide film 42 is etched generally halfway, or before the first silicon oxide film 42 is completely etched, to thereby form an upper section 49 of the through hole. The internal wall of the upper section 49 is formed with a tapered section. For example, condition (1) and condition (2) shown below may be employed:

Condition (1)
  Etching solution: $HF:NH_4F=1:6$
  Temperature of etching solution: Room temperature
  Annealing temperature of the interlayer dielectric film 46: 450° C.
  Under the conditions listed above, the etching speed against the first silicon oxide film 42 and the second silicon oxide film 44 is about 4.3 nm/sec.

Condition (2)
  Etching solution: $HF: NH_4=1:20$
  Temperature of etching solution: Room temperature
  Annealing temperature of the interlayer dielectric film 46: 450° C.
  Under the conditions listed above, the etching speed against the first silicon oxide film 42 and the second silicon oxide film 44 is about 1.1 nm/sec.

Figure 7:
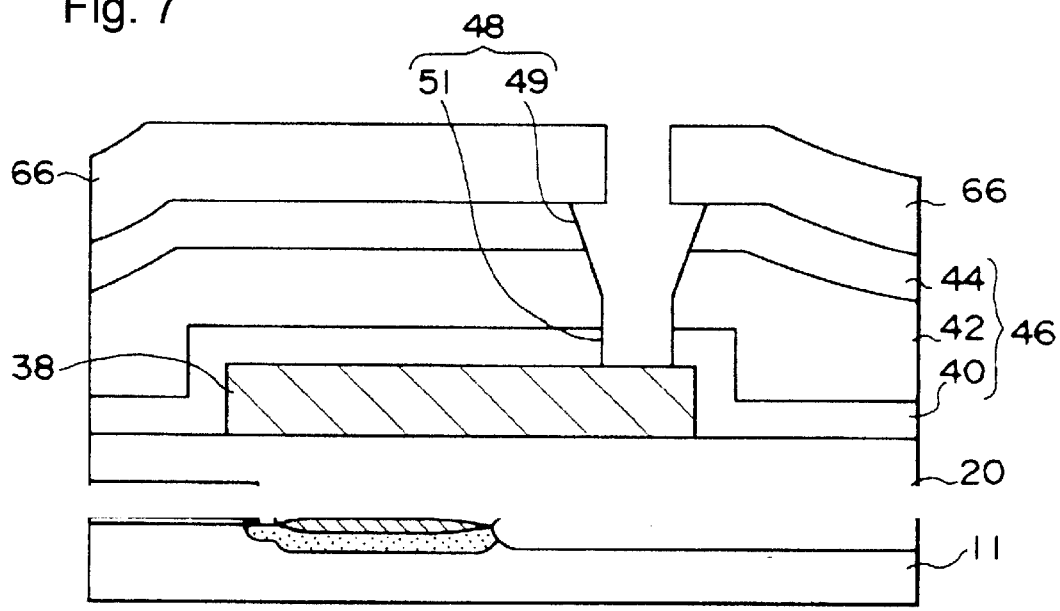
FIG. 7 shows a sixth step in the process for making the semiconductor device in cross section in accordance with the first embodiment of the present invention.

Referring to FIG. 7, portions of the interlayer dielectric film 46 below the upper section 49 are selectively, anisotropically etched. By this etching process, a portion of the first metal wiring layer 38 is exposed. As a result, a lower section 51 of the through hole is formed. For example, the following condition may be employed:

Etching apparatus: Reactive ion etching apparatus
Etching gas: $CH_4$ and $CHF_3$ (and an inert gas, e.g., Ar, He or Ne)
Temperature within the chamber: Room temperature—100° C.
Pressure within the chamber: 0.02–0.5 torr
High frequency power: 300–1000 w Under the conditions listed above, the etching speed against the first silicon oxide film 42 and the third silicon oxide film 40 is about 8–11 nm/sec.

Then, the resist 66 is removed.

By conducting the above-described isotropic etching and anisotropic etching, the through hole 48 having the tapered section is completed. Aluminum films can be deposited well in the through hole 48 having such a configuration, as described below.

Heat treatment including a degasification process will be described below. Lamp heating (heat treatment A) is conducted in a lamp chamber under base pressures of about $1.5 \times 10^{-4}$ Pa or lower, at temperatures of about 150–350° C., and more preferably at temperatures of about 150–250° C., for about 30–60 seconds. Then, in another chamber where argon gas is introduced at pressures of about $1 \times 10^{-1}$–$15 \times 10^{-1}$ Pa, a heat treatment (degasification step: heat treatment B) is conducted at temperatures of 300–500° C. for 30–300 seconds to thereby perform a degasification process.

In this process, first, the entire wafer, including its rear surface and side surface, is heat treated in the heat treatment A to remove water content that adheres to the wafer, as a primary object.

Then, in the heat treatment B, mainly, gasification components (H, $H_2O$) in the first silicon oxide film 42 that forms the interlayer dielectric film 46 are removed. As a result, the generation of gasification components from the interlayer dielectric film 46 can be prevented during film formation of a barrier layer and an aluminum film conducted in later steps.

In accordance with an embodiment of the present invention, a wetting layer, such as, for example, a Ti film may be formed. Such a film contains some atom % of gasification components (0, H, $H_2O$, N) in solid solution. Accordingly, removal of the gasification components in the interlayer dielectric film 46 before forming the wetting layer is effective in successfully forming aluminum films in the through hole 48. Unless the gasification components are sufficiently removed from the interlayer dielectric film 46 below the wetting layer, the gasification components in the interlayer dielectric film 46 may be discharged and enter the wetting layer at a film formation temperature for forming the wetting layer (normally about 300° C. or higher). Further, the gases are separated from the wetting layer when an aluminum film is formed and come out into a boundary between the wetting layer and the aluminum film, causing deteriorating effects on cohesiveness and flowability of the aluminum layer.

Figure 8:
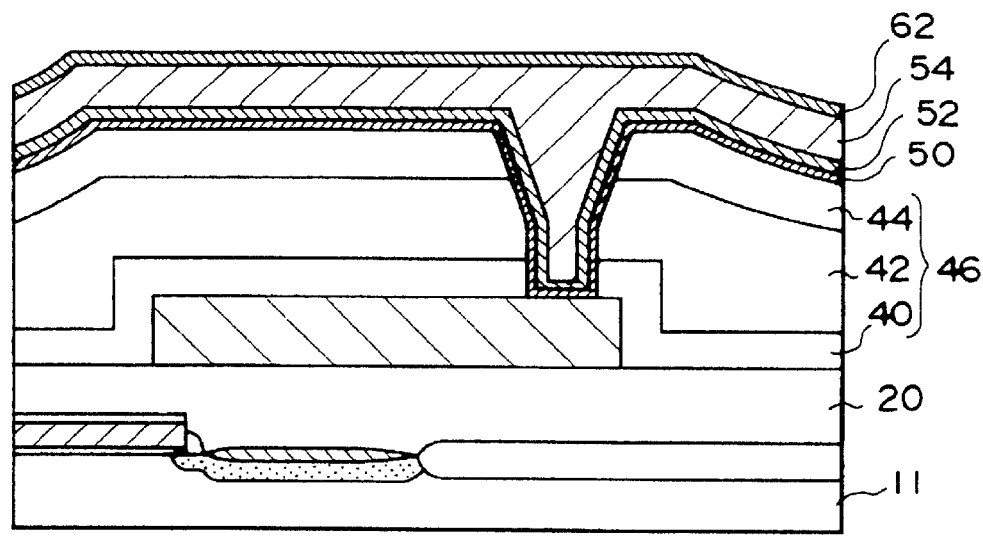
FIG. 8 shows a seventh step in the process for making the semiconductor device in cross section in accordance with the first embodiment of the present invention.

Referring to FIG. 8, a titanium film serving as a wetting layer 50 is formed to a film thickness of about 20–70 nm by a sputtering method. The sputtering is conducted at temperatures of about 200–450° C., depending on the film thickness.

Referring to FIG. 8, before cooling the wafer, heat treatment (heat treatment C) is conducted first in a lamp chamber under base pressures of about $1.5 \times 10^{-4}$ Pa or lower at temperatures of about 150–250° C. for about 30–60 seconds to remove substances such as water adhered to the substrate. Then, before an aluminum film is formed, the substrate temperature is lowered to about 100° C. or lower, and more preferably to the normal temperature—50° C. This cooling step is important to lower the temperature of the substrate which has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric film 46, the wetting layer 50 and the entire surface of the wafer at the time of film formation of a first aluminum film 52 is reduced to a minimum. As a result, this prevents deteriorating effects of the gases which may be adsorbed on the boundary between the wetting layer 50 and the first aluminum film 52 to thereby damage their coverage and cohesiveness.

Referring to FIG. 8, a first aluminum film 52 is formed first by sputtering aluminum containing about 0.2–1.0 weight % of copper at a high speed at temperatures f about 200° C. or lower, and more preferably at about 30–100° C. to a film thickness of bout 150–300 nm. Then, the substrate temperature is elevated to about 420–460° C. in he same chamber, and aluminum similarly containing copper is sputtered at low speed to form a second aluminum film 54 having a film thickness of about 300–600 nm. In this film formation step, the level of "high speed" for film formation of the aluminum films may vary depending on the film forming condition and design specifications of a device to be manufactured. However, in this embodiment, the term "high speed" refers to sputtering speeds of about 10 nm/second or faster, and the term "low speed" refers to sputtering speeds of about 3 nm/second or slower.

Figure 9:
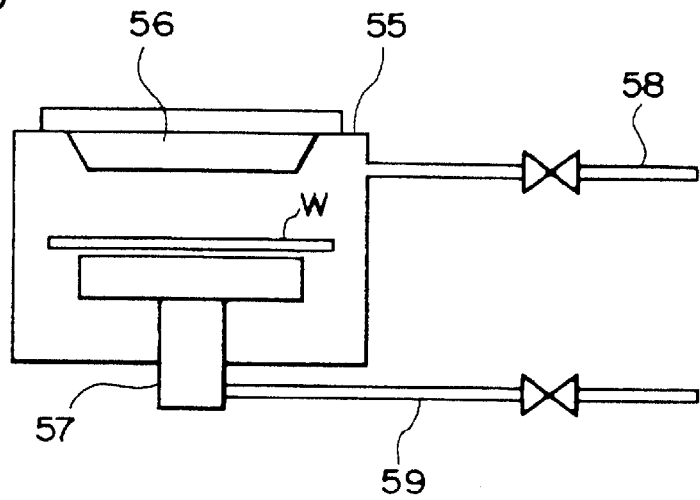
FIG. 9 schematically shows an example of a sputtering apparatus used for embodiments of the present invention.

FIG. 9 schematically shows an example of a sputtering apparatus that is used to form the first and second aluminum films 52 and 54. The sputtering apparatus has a chamber 55, a target 56 functioning also as an electrode and an electrode 57 functioning as a stage. A substrate (wafer) W to be processed is mounted on the electrode 57. A first gas supply channel 58 is connected to the chamber 55. A second gas supply channel 59 is connected to the electrode 57. Both of the gas supply channels 58 and 59 supply argon gas. The temperature of the wafer W is controlled by a gas supplied through the second gas supply channel 59. An exhaust system (not shown) may be provided to exhaust gasses from the chamber 55.

Figure 10:
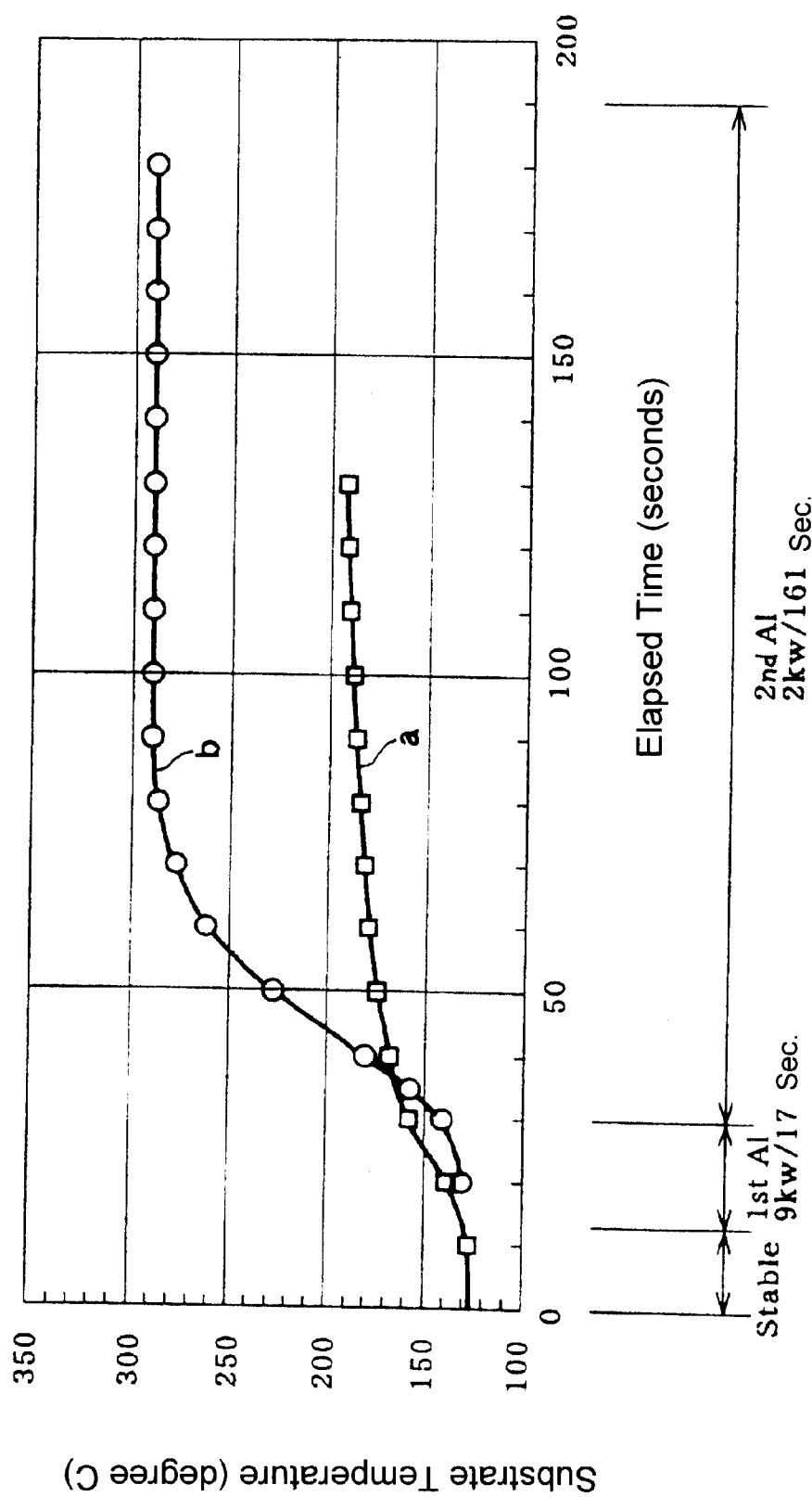
FIG. 10 shows relations between elapsed time and substrate temperatures when the substrate temperature is controlled using the sputtering apparatus shown in FIG. 9.

One example for controlling the substrate temperature by the sputtering apparatus is illustrated in FIG. 10. In FIG. 10, elapsed time is presented along the axis of abscissa, and substrate (wafer) temperatures are presented along the axis of ordinate. A line marked by reference "a" represents changes in the substrate temperature when the stage 57 of the sputtering apparatus is set at 350° C. A line marked by reference "b" represents changes in the substrate temperature when the temperature of the stage 57 is increased by supplying high temperature argon gas through the second gas supply channel 59 into the chamber.

For example, the substrate temperature is controlled as follows. The stage 57 is pre-heated and its temperature is set at a film forming temperature for forming the second aluminum film (at 350–500° C.). When the first aluminum film is formed, the substrate temperature is gradually elevated by heat from the stage 57 without a gas supply from the second gas supply channel 59, as indicated by the line marked by reference "a" shown in FIG. 10. When the second aluminum film is formed, the substrate temperature is controlled to rapidly elevate by supplying heated gas through the second gas supply channel 59, and then to stabilize at a predetermined temperature level, as indicated by the line marked by reference "b" shown in FIG. 10.

In the example shown in FIG. 10, the temperature of the stage is set at 350° C., and the first aluminum film 52 is formed while the substrate temperature is set at 125–150° C., and immediately thereafter, the film formation of the second aluminum film 54 is conducted.

In the process of forming the aluminum films, control of power applied to the sputtering apparatus is important as well as control of the film forming speed and the substrate temperature. In other words, the first aluminum film 52 is formed with high power, and the second aluminum film 54 is formed with lower power, depending on the film forming speed. It is important that the power is not reduced to zero when the power is switched from the high power to the lower power. If the power is reduced to zero, an oxide film is formed on the surface of the first aluminum film even under a reduced pressure, and the wettability of the second aluminum film with respect to the first aluminum film is lowered, and bonding between the films is deteriorated. In other words, by continuously applying power, active aluminum is continuously supplied onto the surface of the aluminum film during the film formation, and formation of an oxide film is suppressed. The level of power is preferably set at about 5–10 kW for the high power and at about 300 W–1 kW for the lower power, for example, under the temperature condition shown in FIG. 10. However, the level of power may vary depending on the variations of the sputtering apparatus and film forming conditions.

By successively forming the first aluminum film 52 and the second aluminum film 54 in the same chamber, the temperature and the power can be precisely controlled and stable aluminum films are effectively formed at a lower temperature than the conventional method.

The thickness of the first aluminum film 52 is selected to be in an appropriate range in consideration of the capability of forming successive layers with good step coverage and the capability of controlling discharge of gasification components from the wetting layer 50 and the interlayer dielectric film 46 below the aluminum film 52. For example, the thickness may preferably be about 100–300 nm. The thickness of the second aluminum film 54 is determined by factors such as the size of the through hole 48 and its aspect ratio. For example, the thickness of about 300–800 nm is necessary to cover a through hole smaller than about 0.5 $\mu$m or less in diameter with aspect ratio of about 3.

Further, an anti-reflection film 62 with a film thickness of about 30–80 nm is formed by sputter-depositing titanium nitride (TiN) in another sputter chamber.

Then, referring to FIG. 1, a laminated layer of the wetting layer 50, the first aluminum film 52, the second aluminum film 54 and the anti-reflection film 62 is selectively etched by an anisotropic dry etching apparatus, using $Cl_2$ and $BCl_3$ gases as main gases, to thereby form a second metal wiring layer 64.

It has been confirmed that, with the second metal wiring layer 64 formed in the manner described above, the through hole 48 is filled by the aluminum with good step coverage without creating voids.

In accordance with the first embodiment, the first silicon oxide film 42 is formed by reacting $SiH_4$ and $H_2O_2$ by a CVD method. The isotropic etching speed for the first silicon oxide film 42 is equal to or generally the same as the etching speed for the second silicon oxide film 44 (the cap layer). As a result, the first silicon oxide film can also be isotropically etched. Therefore, the manufacturing method of the present invention improves the degree of freedom in isotropic etching. With the improved degree of freedom in isotropic etching, the upper section 49 (having an internal wall with a tapered section) of the through hole 48 can be made deeper. Therefore, the through hole 48 can be filled by aluminum with good step coverage without creating voids. Also, planarization of layers formed above these films is improved.

In accordance with the first embodiment, the first silicon oxide film 42 containing silanol is formed by reacting $SiH_4$ and $H_2O_2$ by a CVD method. As a result, the interlayer dielectric film 46 with an excellent planarization is formed. Accordingly, process margins in processes including wiring layer processing are improved, and manufacturing quality and yield are improved.

In particular, if the interlayer dielectric film 46 is formed between the main surface of the silicon substrate 11 and the first metal wiring layer 38 (i.e., at a location where the interlayer dielectric film 20 is formed), the following effects are achieved. The interlayer dielectric film 46 is planarized at substantially lower temperatures compared to the reflow temperature in forming a conventional BPSG film. As a result, device characteristics against punch-through and junction leaks are improved, and further device miniaturization of device elements with highly reliable contact structures is achieved. Also, it is advantageous with respect to the manufacturing process.

In accordance with the first embodiment, at least a degasification process and a cooling process are conducted before sputtering aluminum films and, preferably, the aluminum films are continuously formed in the same chamber. As a result, the through hole having an aperture diameter of about 0.2 μm can be filled only with aluminum or an aluminum alloy. As a result, the device reliability and production yield are improved. Also, it has been confirmed that the aluminum films forming the contact section do not have partial precipitation of copper or abnormal growth of crystal grains, and are highly reliable in various aspects including migration.

In the first embodiment, it is believed that the first and second aluminum films 52 and 54 are embedded well in the through hole 48 due to the following reasons other than the shape of the through hole 48.

By performing the degasification process, water and nitrogen contained in the interlayer dielectric film 46 are gasified and sufficiently discharged. As a result, generation of gases from the interlayer dielectric film 46 and the wetting layer 50 is prevented when the first aluminum films 52 and 54 are formed in later steps. As a consequence, the wetting layer 50 and the first aluminum film 52 can be formed with high coherency and therefore good step coverage.

The substrate temperature is set at a relatively low temperature that is about 200° C. or lower when the first aluminum film 52 is formed. As a result, water and nitrogen contained in the interlayer dielectric film 46 and the wetting layer 50 are prevented from being discharged, with the result that the coherency of the first aluminum film 52 is further increased in addition to the effect provided by the degasification process.

Further, the first aluminum film 52 itself plays a role in restricting the generation of gasses from the underlying layers when the substrate temperature rises. As a result, the second aluminum film 54 can be formed at a relatively high temperature, and therefore flow and diffusion can be optimally conducted for the second aluminum film.

The present invention is not limited to the first embodiment. A variety of modifications may be implemented.

For example, in the first embodiment described above, when the second silicon oxide film 44 is formed by a plasma CVD method, nitrogen monoxide is used as a compound including oxygen. In an alternative embodiment, ozone may be used instead. The wafer may preferably be exposed to an ozone atmosphere before the second silicon oxide film 44 is formed.

Figure 11:
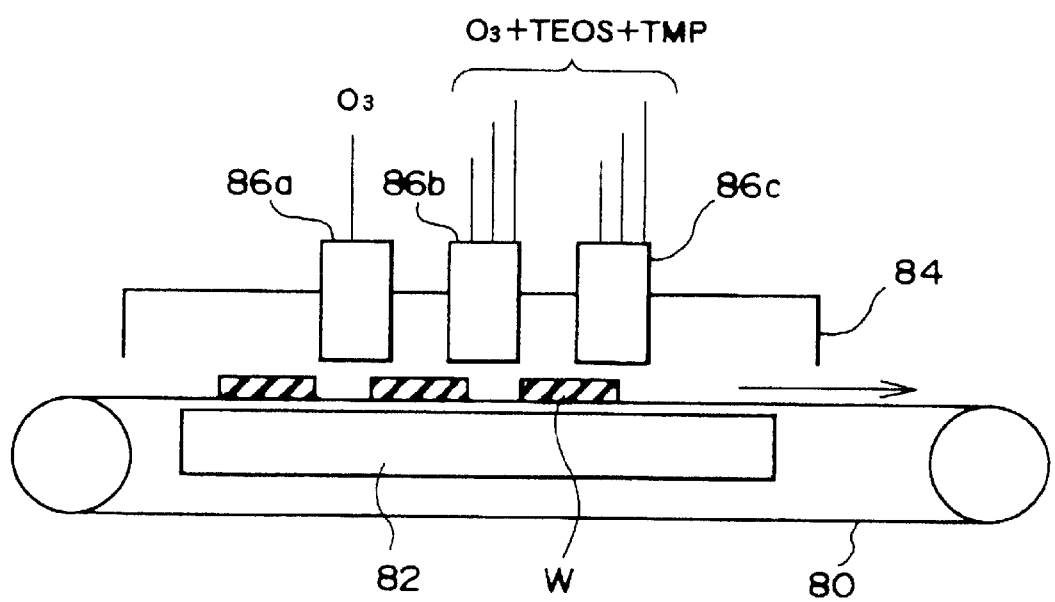
FIG. 11 schematically shows a belt furnace used for embodiments of the present invention.

For example, a belt furnace having a heater 82, as shown in FIG. 11, may be employed. A wafer W is placed on a conveyor belt 80 that is heated at about 400–500° C. by the heater 82 and conveyed at a predetermined transfer speed. In this instance, ozone is supplied through a first gas head 86a, such that the wafer W is transferred in an ozone atmosphere containing about 2–8 weight % ozone for a time period of about 5 minutes or longer. Then, ozone, TEOS and TMP ($P(OCH_3)_3$) are supplied through second and third gas heads 86b and 86c under generally normal pressure to form a PSG film (the second silicon oxide film) 44 to a film thickness of about 100–600 nm with a concentration of about 3–6 weight % phosphorous contained therein. Reference numeral 84 in FIG. 11 denotes a cover.

By using ozone instead of nitrogen monoxide, a silicon oxide film can be formed with TEOS by a normal pressure CVD method. Also, by the use of a belt furnace, film formation steps are successively and effectively conducted.

Also, by exposing the wafer W to an ozone atmosphere, it has been confirmed by a thermal desorption spectroscopy (TDS) and a Fourier-transform infrareds spectroscopy (FTIR) that the first silicon oxide film 42 has a low moisture absorption characteristic and contains a sufficiently low level of water content. Further, the interlayer dielectric film 46 has a good planarization characteristic comparable to the one formed by using nitrogen monoxide as a reactant gas. Also, the first silicon oxide film 42 does not generate cracks.

In the first embodiment, a silicon oxide film as the third silicon oxide film 40 is formed by a plasma CVD method using TEOS. Other types of silicon oxide films may be used instead (particularly when the film is positioned at a forming location of the interlayer dielectric film 20). For example, as the third silicon oxide film, a film may be formed by a high-temperature reduced-pressure thermal CVD method using monosilane and nitrogen monoxide. The silicon oxide film thus formed faithfully follows the surface contour of the underlying layer, and has a high degree of coverage characteristic. Moreover, the film is dense and therefore has a high passivation function. Also, cracks are difficult to occur in the first silicon oxide film 42 even when anneal temperature is rapidly raised in an anneal treatment. Further, the thermal CVD method provides an advantage in that plasma damages are not caused. The term "high-temperature" used herein refers to temperatures of about 700–850° C.

In the first embodiment, the interlayer dielectric film 46 consists of three layers of silicon oxide films. The present invention is not limited to this structure, and other silicon oxide films may be added. For example, a PSG film (with a concentration of about 1–6 weight % phosphorous contained therein) may be formed to a film thickness of about 100–300 nm by a plasma CVD between the third silicon oxide film 40 and the first silicon oxide film 42. It has been confirmed that the gettering function against mobile ions is further improved by inserting the PSG film. Also, by the insertion of the PSG film, internal stresses of the third silicon oxide film 40 that affect the first silicon oxide film 42 are reduced. Also, internal stresses of the first silicon oxide film 42 that affect the third silicon oxide film 40 are reduced.

Further, for example, when the second silicon oxide film 44 has a sufficiently high level of planarization, a thick silicon oxide film may be formed on the second silicon oxide film 44, and the thick silicon oxide film is further planarized by chemicalmechanical polishing (CMP).

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for manufacturing a semiconductor device, the semiconductor device comprising a semiconductor substrate defining a main surface, an interlayer dielectric film located over the main surface and having a through hole, the through hole including an upper surface section, a lower surface section and an internal surface between the upper surface section and the lower surface section, the method comprising the steps of:

(a) reacting a silicon compound with hydrogen peroxide by a CVD method to form a first silicon oxide film that forms at least a part of the interlayer dielectric film and that has a given isotropic etching speed;

(b) reacting a silicon compound with at least one of oxygen and a compound including oxygen by a CVD method to form a second porous silicon oxide film that forms at least a part of the interlayer dielectric film and serves as a cap layer on the first silicon oxide film and that has an isotropic etching speed substantially the same as the given speed of the first silicon oxide film; and (c) selectively, isotropically etching both the first silicon oxide film and the second silicon oxide film, to form the through hole that includes the internal surface having a tapered section in which the through hole becomes smaller in a direction from the upper surface section toward the lower surface section.

2. A method for manufacturing a semiconductor device according to claim 1, further comprising, between the step (b) and the step (c), the step of annealing the interlayer dielectric film at temperatures of about 350–500° C.

3. A method for manufacturing a semiconductor device according to claim 1 or claim 2, wherein the interlayer dielectric film includes a third silicon oxide film as a base layer below the first silicon oxide film, and further including, before the step (a), the step of reacting a silicon compound with at least one of oxygen and a compound including oxygen by a CVD method to form the third silicon oxide film.

4. A method for manufacturing a semiconductor device according to claim 1, wherein the through hole defines a lower section and an upper section that is located above the lower section and includes the tapered section, and the step (c) includes the steps of:

selectively, isotropically etching both the first silicon oxide film and the second silicon oxide film to form the upper section; and selectively, anisotropically etching the interlayer dielectric film located below the upper section to form the lower section.

5. A method for manufacturing a semiconductor device according to claim 1, wherein a wiring is formed on the interlayer dielectric film, and further including, after the step (c), the steps of:

forming a barrier layer that becomes a part of the wiring on surfaces of the through hole and the interlayer dielectric film; and forming a conductive film that becomes a part of the wiring on surfaces of the barrier layer.

6. A method for manufacturing a semiconductor device according to claim 5, wherein the conductive film is provided by forming a first aluminum film composed of at least one of aluminum and an aluminum alloy containing aluminum as a main component at temperatures of about 200° C. or lower, and then forming a second aluminum film composed of at least one of aluminum and an aluminum alloy containing aluminum as a main component at temperatures of about 300° C. or higher.

7. A method for manufacturing a semiconductor device according to claim 1, wherein the silicon compound used in the step (a) is at least one selected from a group of inorganic silane compounds including monosilane, disilane, $SiH_2Cl_2$ and $SiF_4$, and a group of organo silane compounds including $CH_3SiH_3$, dimethylsilane, tripropylesilane and tetraethylorthosilicate.

8. A method for manufacturing a semiconductor device according to claim 7, wherein the silicon compound is an inorganic silane compound, and the step (a) is conducted by a reduced pressure CVD method at temperatures of about 0–20° C.

9. A method for manufacturing a semiconductor device according to claim 7, wherein the silicon compound is an organo silane compound, and the step (a) is conducted by a reduced pressure CVD method at temperatures of about 0–150° C.

10. A method for manufacturing a semiconductor device according to claim 1, wherein the step (b) is conducted by a plasma CVD method at temperatures of about 300 450° C.

11. A method for manufacturing a semiconductor device according to claim 10, wherein the compound including oxygen used in the step (b) is nitrogen monoxide.

12. A method for manufacturing a semiconductor device according to claim 1, wherein the step (b) is conducted at temperatures of about 300–550° C. by a normal pressure CVD method.

13. A method for manufacturing a semiconductor device according to claim 12, wherein the compound containing oxygen used in the step (b) is ozone.

14. A method for manufacturing a semiconductor device according to claim 1, wherein, in the step (b), the first silicon oxide film is exposed to an ozone atmosphere before the second silicon oxide film is formed.

* * * * *